(12) United States Patent
Tan

(10) Patent No.: US 12,721,156 B2
(45) Date of Patent: Aug. 25, 2026

(54) DEVICE MODULE, MANUFACTURING METHOD THEREFOR, AND INDUCTOR-CAPACITOR ARRAY

(71) Applicant: SG MICRO CORP, Beijing (CN)

(72) Inventor: Lei Tan, Beijing (CN)

(73) Assignee: SG MICRO CORP, Beijing (CN)

( * ) Notice: Subject to any disclaimer, the term of this patent is extended or adjusted under 35 U.S.C. 154(b) by 416 days.

(21) Appl. No.: 18/552,219

(22) PCT Filed: Apr. 8, 2022

(86) PCT No.: PCT/CN2022/085786
§ 371 (c)(1),
(2) Date: Sep. 25, 2023

(87) PCT Pub. No.: WO2022/214072
PCT Pub. Date: Oct. 13, 2022

(65) Prior Publication Data

US 2024/0170391 A1 May 23, 2024

(30) Foreign Application Priority Data

Apr. 9, 2021 (CN) ........................ 202110383001.9

(51) Int. Cl.
*H10W 20/40* (2026.01)
*H10D 1/20* (2025.01)
(Continued)

(52) U.S. Cl.
CPC ............ *H10W 20/496* (2026.01); *H10D 1/20* (2025.01); *H10D 1/716* (2025.01);
(Continued)

(58) Field of Classification Search
CPC . H10W 20/496; H10W 20/497; H10W 90/00; H10W 90/297; H10W 70/685;
(Continued)

(56) References Cited

U.S. PATENT DOCUMENTS

2010/0090781 A1* 4/2010 Yamamoto ............... H05K 1/16 333/167
2019/0115149 A1* 4/2019 Lu ......................... H01F 27/346

FOREIGN PATENT DOCUMENTS

CN 103050224 A 4/2013
CN 103366946 B 3/2017
(Continued)

OTHER PUBLICATIONS

International Search Report and Written Opinion for International Application No. PCT/CN2022/085786, dated Jun. 20, 2022, 13 pages.

*Primary Examiner* — Julia Slutsker
(74) *Attorney, Agent, or Firm* — Westman, Champlin & Koehler, P.A.

(57) ABSTRACT

A device module includes first and second conductive layers, and first and second functional layers between the first and second conductive layers. The first functional layer includes a plurality of capacitors and a plurality of via electrodes isolated from the plurality of capacitors. A plurality of inductors are formed in the second functional layer, each arranged along a thickness direction of the second functional layer. Thus, a first terminal of the inductor is electrically coupled with the first conductive layer through corresponding one of the via electrodes, and a second terminal of the inductor is electrically coupled with the second conductive layer. The device module simplifies the layout and wiring of a multi-phase circuit by directly installing the driver on the multi-inductor array with the pins being arranged longitudinally, and improves the effective utilization of inductor and capacitor materials.

15 Claims, 6 Drawing Sheets

(51) Int. Cl.

*H10D 1/68* (2025.01)
*H10W 90/00* (2026.01)
*H10W 90/20* (2026.01)

(52) U.S. Cl.

CPC ......... *H10W 20/497* (2026.01); *H10W 90/00* (2026.01); *H10W 90/297* (2026.01)

(58) Field of Classification Search

CPC .......... H10D 1/20; H10D 1/716; H01F 17/04; H01F 27/40; H01F 2017/048; H02M 3/003; H02M 3/1586; H02M 1/00; H03H 11/28; H01L 23/5223; H01L 23/5227; H01L 25/0657; H01L 2225/06541

See application file for complete search history.

(56) References Cited

FOREIGN PATENT DOCUMENTS

| | | | |
|---|---|---|---|
| CN | 107887108 | A | 4/2018 |
| CN | 109088612 | A | 12/2018 |
| CN | 111200351 | A | 5/2020 |
| JP | 2001076952 | A | 3/2001 |
| JP | 2006311203 | A | 11/2006 |
| JP | 2019176025 | A | 10/2019 |

* cited by examiner

DEVICE MODULE, MANUFACTURING METHOD THEREFOR, AND INDUCTOR-CAPACITOR ARRAY

CROSS-REFERENCES TO RELATED APPLICATION

This application is a Section 371 National Stage application of International Application No. PCT/CN2022/085786, filed on Apr. 8, 2022, which published as WIPO Publication No. WO 2022/214072 A1, on Oct. 13, 2022, not in English, and claims priority to a Chinese patent application No. 202110383001.9, filed on Apr. 9, 2021, entitled "DEVICE MODULE, MANUFACTURING METHOD THEREFOR, AND INDUCTOR-CAPACITOR ARRAY", the contents of which are incorporated herein by reference in their entireties.

FIELD OF TECHNOLOGY

The disclosure relates to the technical field of power supply equipment, in particular to a device module, a manufacturing method therefor and an inductor-capacitor array.

BACKGROUND

The rapid development of computer technology has led mankind into the information society, but also promoted the rapid development of power module technology. In the 1980, the switching power supply was fully used in computers, and the replacement of computer power supply was first completed. Then the switching power supply technology has entered the field of electronic and electrical equipment.

The rapid development of communication industry has greatly promoted the development of communication power supply. High-frequency and miniaturized switching power supply and its technology have become the mainstream of modern communication power supply system, and the application of multi-phase power supply technology is more and more, so the modular integration of multi-phase power supply is also a key point. In the prior art, the integration method of the power supply module mainly comprises the following steps of: arranging an inductor, a capacitor and an integrated circuit into a package to form the power supply module. Or, the inductor is used as a base for mounting an integrated circuit and a capacitor element.

However, in the integration method in the prior art, due to the limitation of the module size, the proportion of the size of the inductor element in the module is greatly limited during the modular integration of the multiple-phase power supply, and the inductor is an important factor affecting the power output of the power supply module, and the power output of the power supply module will be seriously affected if the size of the inductor is limited. Meanwhile, the conventional integration method has the problem of difficult wiring, which increases the complexity of the multi-phase power supply module, and even causes the problem of low utilization rate of inductor and capacitor materials, affecting the accuracy and cost of the integrated power supply.

SUMMARY

In order to solve the above technical problems, the present disclosure provides a device module, a manufacturing method therefor, and an inductor-capacitor array, which simplifies implementation of a multiple-phase power supply, effectively utilizes inductor and capacitor materials, and is beneficial for improving the power output of the power supply module.

According to a first aspect of the present disclosure, there is provided a device module comprising: a first conductive layer, a second conductive layer, and a first functional layer and a second functional layer between the first conductive layer and the second conductive layer, wherein the first functional layer includes a plurality of capacitors and a plurality of via electrodes isolated from the plurality of capacitors; a plurality of inductors are formed in the second functional layer, each of which is arranged along a thickness direction of the second functional layer so that a first terminal of the inductor is electrically coupled with the first conductive layer through corresponding one of the via electrodes, and a second terminal of the inductor is electrically coupled with the second conductive layer.

Optionally, the device module further comprises a driver chip above the first conductive layer, wherein the driver chip is electrically coupled to the plurality of capacitors in the first functional layer and the plurality of inductors in the second functional layer through the first conductive layer.

Optionally, the driver chip comprises a multi-phase switching power supply chip.

Optionally, the first functional layer comprises: an upper electrode plate below the first conductive layer; a lower electrode plate above the second functional layer; and a capacitor dielectric layer between the upper electrode plate and the lower electrode plate, wherein the first electrode plate of each of the plurality of capacitors is formed in the upper electrode plate, the second electrode plate of each of the plurality of capacitors is formed in the lower electrode plate, and each of the plurality of via electrodes penetrates through the upper electrode plate, the capacitor dielectric layer, and the lower electrode plate.

Optionally, the device module further comprises: a plurality of pins above the first conductive layer, wherein the plurality of pins are respectively disposed at two sides of the driver chip; and an encapsulation layer which covers the driver chip and exposed portions of the first conductive layer.

According to a second aspect of the present disclosure, there is provided an inductor-capacitor array, comprising: a first conductive layer, a second conductive layer, and a lamination structure between the first conductive layer and the second conductive layer, the lamination structure comprising an inductor layer and a capacitor layer, wherein the capacitor layer includes a plurality of capacitors and a plurality of via electrodes isolated from the plurality of capacitors; a plurality of inductors are formed in the inductor layer, each of which is arranged along a thickness direction of the inductor layer so that a first terminal of the inductor is electrically coupled with the first conductive layer through corresponding one of the via electrodes, and a second terminal of the inductor is electrically coupled with the second conductive layer.

Optionally, the capacitor layer comprises: an upper electrode plate below the first conductive layer; a lower electrode plate above the inductor layer; and a capacitor dielectric layer between the upper electrode plate and the lower electrode plate, wherein the first electrode plate of each of the plurality of capacitors is formed in the upper electrode plate, the second electrode plate of each of the plurality of capacitors is formed in the lower electrode plate, and each of the plurality of via electrodes penetrates through the upper electrode plate, the capacitor dielectric layer, and the lower electrode plate.

Optionally, the inductor layer comprises: a core; and a plurality of coils in the core, each of which is formed by winding around an axis along a thickness direction of the core, and both ends of which are led out from opposite end surfaces of the core in the thickness direction.

Optionally, the core is formed by sealing the plurality of coils with a sealing material by a resin molding method or an integral die-casting method.

Optionally, the inductor-capacitor array further comprises a plurality of first scribe lanes extending in a first direction and a plurality of second scribe lanes extending in a second direction, the first and second scribe lanes crossing each other to divide the lamination structure into a plurality of sub-regions, each sub-region comprising a plurality of inductor-capacitor cells.

Optionally, the inductor-capacitor array further comprises a plurality of driver chips respectively in the plurality of sub-regions, in each sub-region, the plurality of inductor-capacitor cells being electrically coupled to corresponding one of the plurality of driver chips through the first conductive layer.

Optionally, the inductor-capacitor array further comprises at least one pin on the first scribe lane or the second scribe lane, wherein the at least one pin is configured to be electrically coupled to the first conductive layer.

Optionally, at least one pin is shared by adjacent sub-regions.

Optionally, the inductor-capacitor array is divided into a plurality of device modules along the first scribe lane and the second scribe lane between the adjacent sub-regions.

According to a third aspect of the present disclosure, there is provided a manufacturing method for the device module, comprising: forming a lamination structure comprising an inductor layer and a capacitor layer which are laminated; forming a first conductive layer on a first surface of the lamination structure; forming a second conductive layer on a second surface of the lamination structure opposite to the first surface; dividing the lamination structure into a plurality of sub-regions through a first scribe lane and a second scribe lane, wherein each sub-region comprises a plurality of inductor-capacitor cells; and such that adjacent sub-regions are separated into a plurality of device modules.

Optionally, the step of forming the lamination structure comprises: providing a capacitor dielectric layer, wherein the capacitor dielectric layer comprises a third surface and a fourth surface which are opposite to each other; forming a plurality of through holes on the capacitor dielectric layer; forming an upper electrode plate and a lower electrode plate on the third surface and the fourth surface of the capacitor dielectric layer respectively, wherein the plurality of through holes penetrate through the upper electrode plate, the capacitor dielectric layer and the lower electrode plate; providing an inductor layer, and attaching the inductor layer to the lower electrode plate, wherein a plurality of inductors are formed in the inductor layer, each of which is arranged along a thickness direction of the inductor layer; and fabricating a conductive material over the upper electrode plate, the conductive material filling the plurality of through holes to form a plurality of via electrodes for electrical connection between the first conductive layer and first terminals of the plurality of inductors.

Optionally, after forming the second conductive layer on the second surface of the lamination structure opposite to the first surface, the manufacturing method further comprises: arranging a plurality of driver chips above the first conductive layer, the plurality of driver chips being respectively in the plurality of sub-regions, and in each sub-region, a plurality of inductor-capacitor cells are electrically coupled with corresponding one of the plurality of driver chips through the first conductive layer.

Optionally, after arranging the plurality of driver chips over the first conductive layer, the manufacturing method further comprises: arranging at least one pin on a first scribe lane or a second scribe lane, wherein the at least one pin is electrically coupled with the first conductive layer, and adjacent sub-regions share the at least one pin; and forming an encapsulation layer which covers the driver chips and exposed portions of the first conductive layer.

The multi-phase power module has the beneficial effects that the multi-inductor array with the pins being arranged longitudinally is manufactured by an integrated process, and then the capacitor layer and the driver chip are stacked on the multi-inductor array serving as a base, so that a footprint of inductors in the multi-phase power module is increased, and the power output of the power module is improved. And the scheme of directly installing the driver on the multi-inductor array with pins being arranged longitudinally greatly simplifies the layout and wiring of the multi-phase circuit, and improves the effective utilization of the inductor and capacitor materials.

BRIEF DESCRIPTION OF THE DRAWINGS

The above and other objects, features and advantages of the present disclosure will become more apparent from the following description of embodiments of the present disclosure with reference to the accompanying drawings.

DESCRIPTION OF THE EMBODIMENTS

Figure 1:
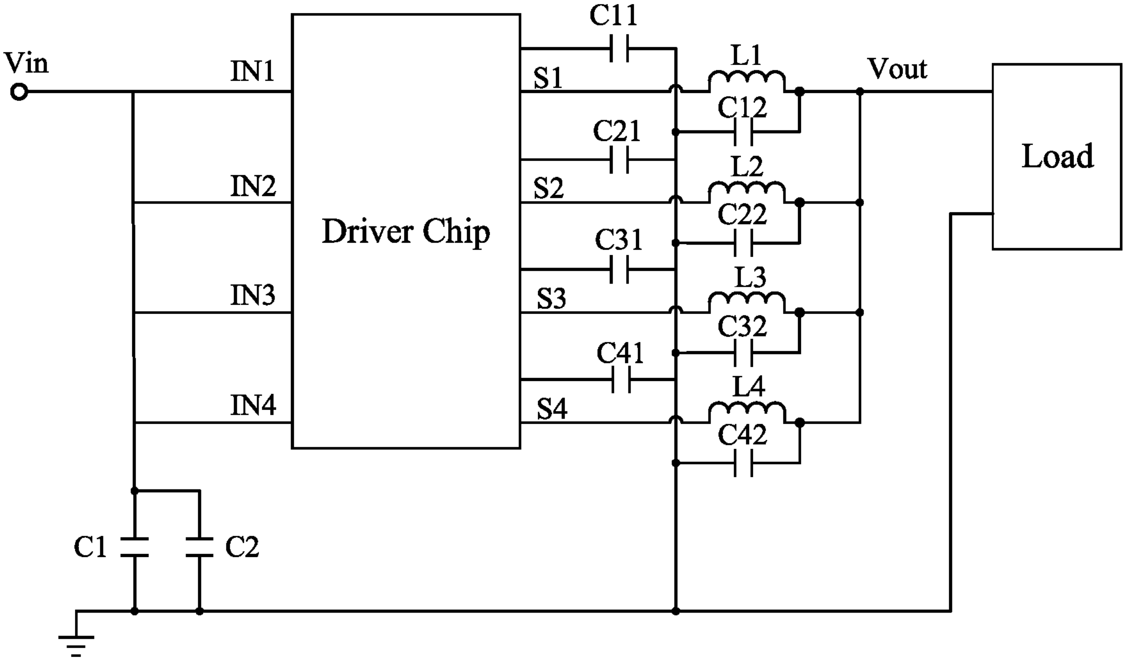
FIG. 1 shows a circuit schematic of a multiple-phase power module.

The present disclosure will be described in more detail below with reference to the accompanying drawings. Throughout the various figures, like elements are denoted by like reference numerals. For the sake of clarity, various parts in the drawings are not drawn to scale. Moreover, some well-known parts may not be shown. For the sake of simplicity, the semiconductor structure obtained after several steps can be described in one diagram.

It should be understood that when describing the structure of a device, when referring to one layer or region as being "above" or "on top of" another layer or region, it can mean that it is directly positioned above the other layer or region, or that there are other layers or regions in between. Additionally, if the device is flipped, the layer or region will be positioned "below" or "underneath" the other layer or region.

If it is necessary to describe a situation where something is directly located above another layer or area, this article will use the expressions "directly above" or "above and adjacent to" to describe it.

FIG. 1 shows a circuit schematic of a multiple-phase power module.

The present disclosure mainly relates to an integrated package of a multi-phase power supply module. The multiple-phase power supply is formed by connecting a plurality of single-phase power supply circuits in parallel and determining timing of each phase on the basis of parallel configuration. A plurality of output channels of the multiple-phase power supply are turned on in sequence according to a certain timing sequence.

As shown in FIG. 1, taking 4 phases as an example, the multi-phase power module comprises capacitors, inductors, a driver chip and a load. The capacitors C1 and C2 are filter capacitors for filtering an input Vin signal of the driver chip. The inductors L1 to L4 are used as energy conversion devices on each output channel of the multi-phase power supply. The capacitors C11 to C12 are filter capacitors for filtering an output Vout signal. The driver chip is used for controlling on time and sequence of each output channel of the multiple-phase power supply module to a load.

Preferably, in the driver chip, IN1 to IN4 are four signal input terminals of the driver chip, and S1 to S4 are four signal output terminals of the driver chip.

Preferably, when the multi-phase power module is encapsulated, if an overall material is not changed, the resistance of each channel is increased by 4 times and the current is shared by ¼. The resistive loss is proportional to the square of the current and the resistance, and the resistive loss of each phase of the 4-phase configuration is reduced to ¼ of that of a single-phase power module. Thus, a single inductor has a reduced current peak value and can be realized. With 4 phases being evenly interleaved, the ripple frequency is increased by 4 times, which reduces the filtering pressure.

Moreover, because of a square relationship between the inductance and the winding length, if the magnetic material is not added, the inductance is reduced to 1/16 of that of a single inductor. In order to reduce the ripple, the multi-phase configuration requires more magnetic material and the highest possible switching frequency to ensure improved performance. For example, an original inductance may be maintained by increasing an amount of magnetic material by 4 times for the inductor of each phase. In principle, the multiple-phase circuit is at the expense of using more magnetic materials and occupying more circuit layout area.

Figure 2:
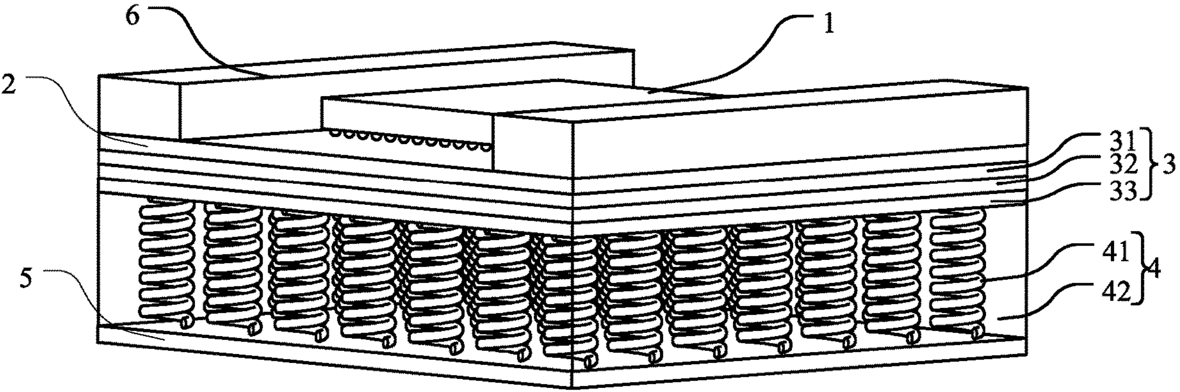
FIG. 2 is a schematic diagram showing an overall structure of the device module according to a first embodiment of the present disclosure.

FIG. 2 is a schematic diagram showing a structure of the device module according to a first embodiment of the present disclosure.

As shown in FIG. 2, the power module according to the embodiment of the present disclosure includes a driver chip 1, a first conductive layer 2, a first functional layer 3, a second functional layer 4, a second conductive layer 5, and at least one pin 6. The first functional layer 3 and the second functional layer 4 are disposed between the first conductive layer 2 and the second conductive layer 5. The first functional layer 3 is provided with a plurality of capacitors and a plurality of via electrodes (not shown in the figure) isolated from the plurality of capacitors. The second functional layer 4 is formed with a plurality of inductors, each of which is arranged in a thickness direction of the second functional layer 4 such that a first terminal of the inductor is electrically coupled to the first conductive layer 2 through corresponding one of the via electrodes, and a second terminal of the inductor is electrically coupled to the second conductive layer 5.

The driver chip 1 is disposed above the first conductive layer 2, and the driver chip 1 is electrically coupled to the plurality of capacitors in the first functional layer 3 and the plurality of inductors in the second functional layer 4 through the first conductive layer. The driver chip is, for example, a multi-phase switching power supply chip, and the device module is, for example, a multi-phase power supply module.

At least one pin 6 is disposed above the first conductive layer 2 and at both sides of the driver chip. Furthermore, the device module further includes an encapsulation layer (not shown in the figure), which covers exposed portions of the driver chip 1 and the first conductive layer 2. The at least one pin 6 is used for providing electrical connection of the driver chip 1, the first functional layer 3 and the second functional layer 4 with the outside.

Preferably, the first functional layer 3 includes an upper electrode plate 31, a capacitor dielectric layer 32, and a lower electrode plate 33. The upper electrode plate 31 is disposed below the first conductive layer 2, the lower electrode plate 33 is disposed above the second functional layer 4, the capacitor dielectric layer 32 is disposed between the upper electrode plate 31 and the lower electrode plate 33. A first electrode plate of each capacitor is formed in the upper electrode plate, a second electrode plate of each capacitor is formed in the lower electrode plate. Each of the via electrodes passes through the upper electrode plate 31, the capacitor dielectric layer 32, and the lower electrode plate 33. Preferably, the upper electrode plate 31 and the lower electrode plate 33 may be formed by coating a thick low-capacitance dielectric on the capacitor dielectric layer 32, which is not limited by the present disclosure.

Preferably, the second functional layer 4 comprises a plurality of coils 41 and a core 42. The plurality of coils 41 are located in the core 42, and each of the coils 41 is formed by winding around an axis along a thickness direction of the core 42. The two ends of the coil 41 are respectively led out from opposite end surfaces of the core 42 in the thickness direction.

Preferably, the plurality of coils 41 may be made of enameled wires or metal wires. The coils may be spiral coils, which may be circular spiral, multilateral spiral or folded.

Preferably, the core 42 is formed by sealing the plurality of coils 41 with a sealing material by a resin molding method or an integral die-casting method. In this embodiment, a sealing material may be formed by mixing and granulating ferrous metal magnetic powder and/or epoxy resin into a powder. A plurality of coils 41 are placed into a molding groove with two ends of the coils extend out of the molding groove. Then, the sealing material is added into the molding groove for die-casting to obtain the second functional layer 4.

It should be noted that the manufacturing method of the second functional layer 4 in this embodiment is not limited to the above embodiment, and a person skilled in the art may select other manufacturing methods according to specific circumstances.

FIG. 3*a* to FIG. 3*h* are schematic cross-sectional views respectively showing steps of a manufacturing method for a device module according to a second embodiment of the present disclosure.

Figure 3A:
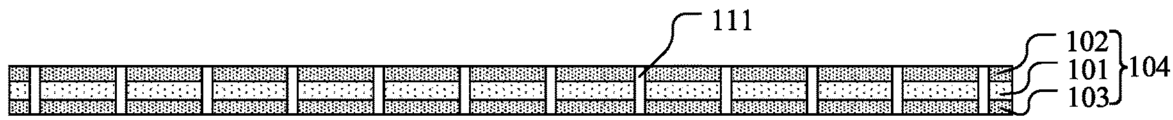
FIGS. 3*a* to 3*h* are schematic cross-sectional views showing respective stages of a manufacturing method for a device module according to a second embodiment of the present disclosure.

As shown in FIG. 3*a*, a capacitor dielectric layer 101 is provided. An electrode and a plurality of through holes 111 are formed on the capacitor dielectric layer 101 by an etching process. The through holes 111 pass through the capacitor dielectric layer 101. Then, an upper electrode plate 102 and a lower electrode plate 103 are respectively formed on upper and lower surfaces of the capacitor dielectric layer 101. For example, a resist layer may be formed on the surface of the capacitor dielectric layer 101, and a pattern including an opening may be formed in the resist layer by a photolithography process. With the resist layer as a mask, exposed portions of the capacitor dielectric layer 101 are removed with a selective etchant, thereby forming an electrode pattern and a via hole 111 at the surface of the capacitor dielectric layer 101. For example, the upper electrode plate 102 and the lower electrode plate 103 can be obtained by coating a thick low-capacitance dielectric material on the upper and lower surfaces of the capacitor dielectric layer 101. The upper electrode plate 102, the lower electrode plate 103, and the capacitor dielectric layer 101 between the upper electrode plate 102 and the lower electrode plate 103 constitute together a capacitor layer 104. A first electrode plate of each capacitor is formed in the upper electrode plate 102, a second electrode plate of each capacitor is formed in the lower electrode plate 103. A plurality of through holes 111 extend through the upper electrode plate 102, the capacitor dielectric layer 101, and the lower electrode plate 103 to isolate the plurality of capacitors from each other.

Figure 3B:
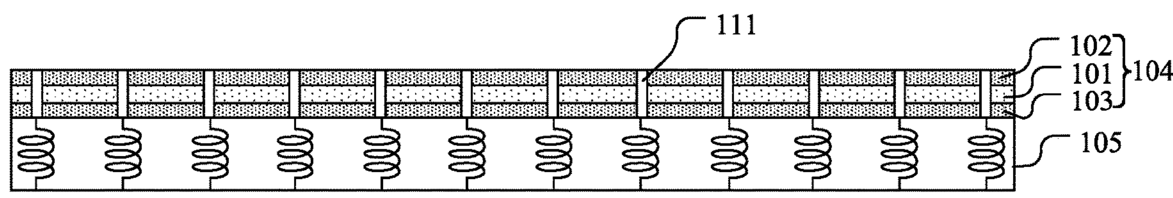

As shown in FIG. 3*b*, an inductor layer 105 is provided. A lower electrode plate 103 of the capacitor layer 104 is bonded to the inductor layer 105. A conductive material is formed above the upper electrode plate 102, so that the conductive material fills the plurality of through holes 111 to form a plurality of via electrodes. The inductor layer 105 includes a plurality of inductors. Each of the inductors is arranged along a thickness direction of the inductor layer 105 so that a first terminal of the inductor is electrically coupled to the corresponding via electrode. For example, the inductor layer 105 may be formed by a resin molding method or an integral die casting method, and a conductive material may be formed on the upper electrode plate 102 by an evaporation or deposition process.

Figure 3C:
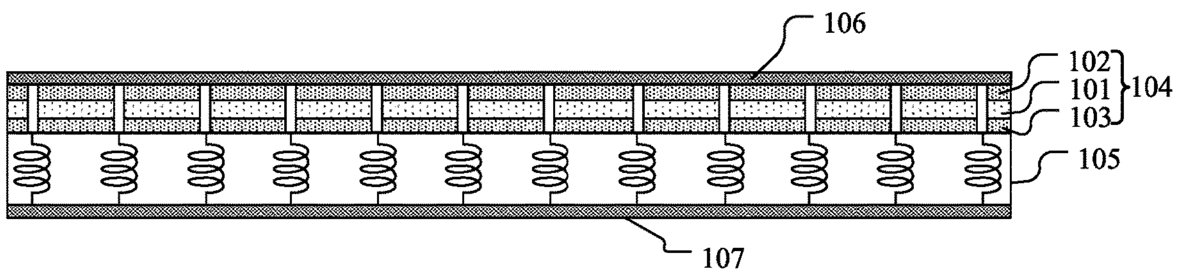

As shown in FIG. 3*c*, a first conductive layer 106 and a second conductive layer 107 are respectively formed on upper and lower surfaces of the lamination structure consisting of the capacitor layer 104 and the inductor layer 105, so as to form an inductor-capacitor array. For example, a conductive material is formed on the upper and lower surfaces of the lamination structure by an evaporation or deposition process, and then patterned by a photolithography and etching process to have electrode shapes, thereby forming the first conductive layer 106 and the second conductive layer 107. First terminals of the plurality of inductors in the inductor layer 105 are electrically coupled to the first conductive layer 106 through via electrodes, and second terminals of the plurality of inductors are electrically coupled to the second conductive layer 107.

Figure 4:
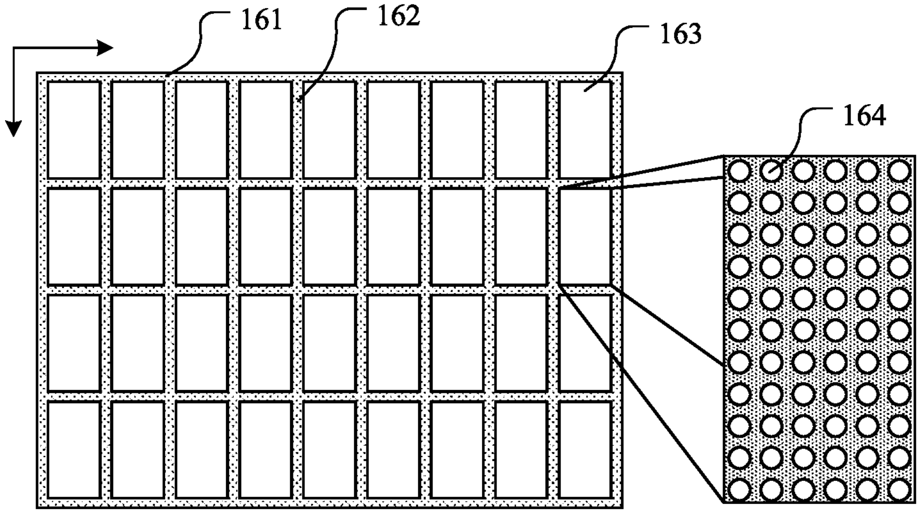
FIG. 4 shows a schematic plan view of the inductor-capacitor array in FIG. 3*c*.

Preferably, as shown in FIG. 4, a plurality of first scribe lanes 161 extending along a first direction and a plurality of second scribe lanes 162 extending along a second direction are reserved on the lamination structure. The first scribe lanes 161 and the second scribe lanes 162 cross each other to divide the lamination structure into a plurality of sub-regions 163. Each sub-region 163 includes a plurality of inductor-capacitor cells 164. The first scribe lanes 161 and the second scribe lanes 162 are reserved scribe gaps for separating the plurality of sub-regions 163.

Figure 3D:
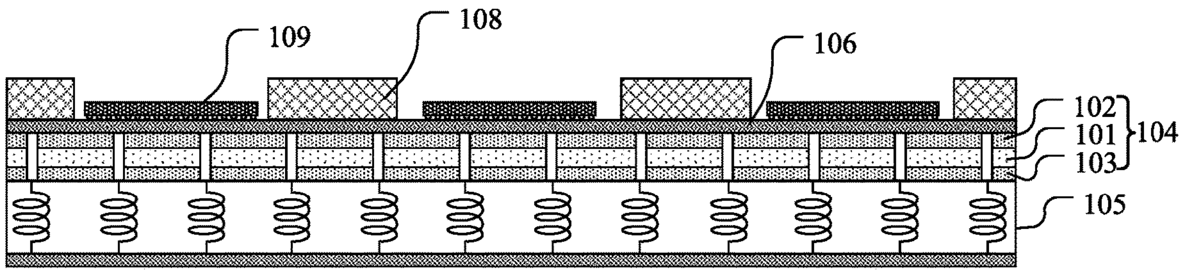

As shown in FIG. 3*d*, at least one pin 108 and a plurality of driver chips 109 are formed on the first conductive layer 106. The at least one pin 108 is electrically connected with the first conductive layer 106. For example, the at least one pin 108 is disposed on the first scribe lanes or the second scribe lanes. In the plurality of sub-regions which are divided as being shown in FIG. 4, at least one pin 108 is shared by adjacent sub-regions. For example, the at least one pin 108 may be formed on the first conductive layer 106 by depositing a metal material and etching. A plurality of driver chips 109 are then mounted on the first conductive layer 106. For example, the plurality of driver chips 109 may be mounted in the plurality of sub-regions which are divided as being shown in FIG. 4. The driver chips 109 are separated from each other. In each sub-region, the plurality of inductor-capacitor cells are electrically coupled to corresponding one of the plurality of driver chips 109 through the first conductive layer 106.

Figure 3E:
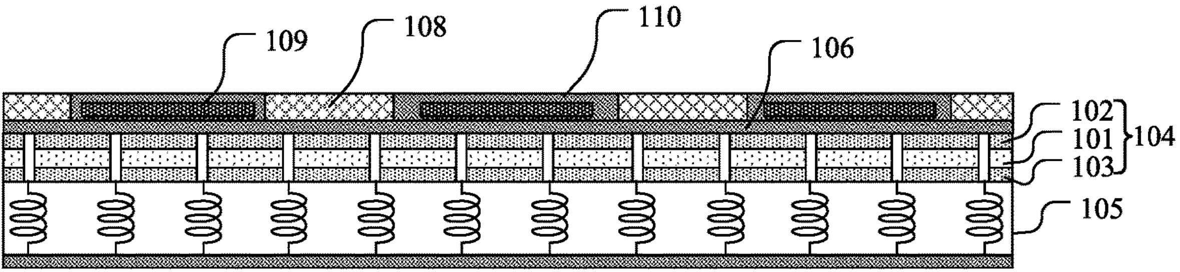

As shown in FIG. 3*e*, after a plurality of driver chips 109 are mounted on the first conductive layer 106, an encapsulation layer 110 is formed to cover the plurality of driver chips 109 and exposed portions of the first conductive layer 106. For example, a casting process can be used to mold a plastic into a predetermined shape, thereby forming an encapsulation layer 110 on the resultant inductor-capacitor array. The casting process includes casting, injection molding, transfer molding, and compression molding, etc. Preferably, after the encapsulation layer 110 is formed, the inductor-capacitor array is thinned from the top of the encapsulation layer 110. For example, the surface of the inductor-capacitor array is planarized by chemical mechanical polishing (CMP), or isotropic back etching after spin coating. Then, the resultant inductor-capacitor array is thinned.

Figure 3F:
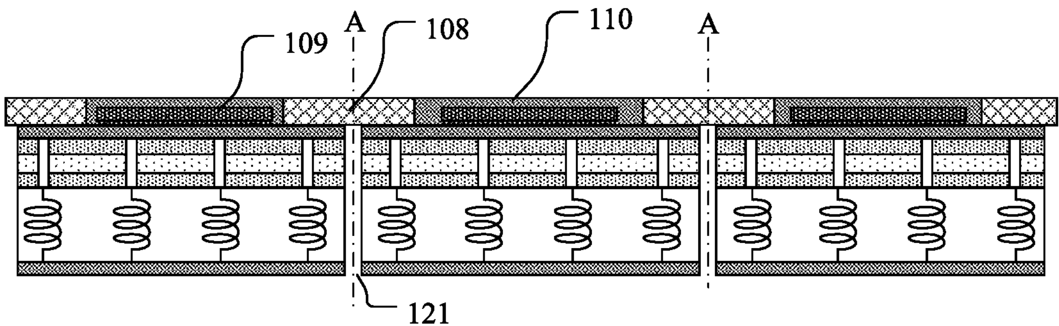

As shown in FIG. 3*f*, after formation of the encapsulation layer 110 and the thinning process, a first division trench 121 is formed in the inductor-capacitor array along an axis A extending along a thickness direction of the inductor-capacitor array between adjacent sub-regions. For example, the first division trench 121 is formed by sawing, etching or laser separation. The first division trench 121 extends from a surface of the second conductive layer 107 that is opposite to the inductor layer 105 to a surface of the first conductive layer 106 that is opposite to the capacitor layer 104. Here, the pin 108 shared between the adjacent sub-regions serves as a connecting part and mechanical fixation.

For example, before forming the first division trench 121, a blue film is attached to an upper surface of the lamination structure. Then, the first division trench is formed along an axis A between the adjacent sub-regions in the inductor-capacitor array. Here, the "blue film" is a PE film commonly used when cutting the wafer.

Figure 3G:
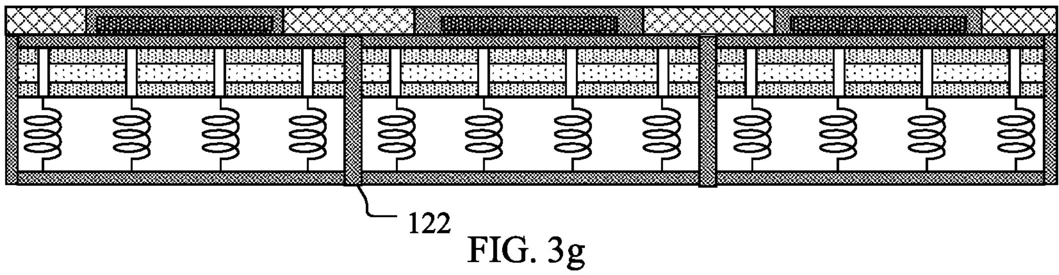

As shown in FIG. 3*g*, the first division trench 121 is at least partially filled with a filling material 122. For example, the filling material 122 is a polymer material such as silicone or epoxy.

Figure 3H:
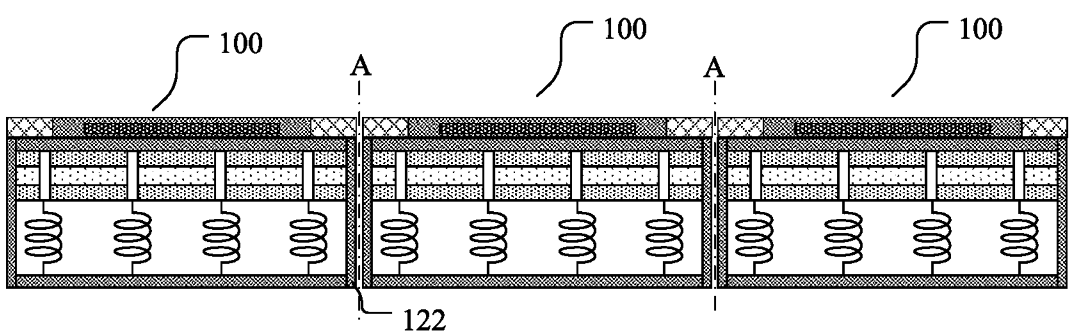

As shown in FIG. 3*h*, after the first division trench 121 is filled with the filling material 122, the inductor-capacitor array is divided into separate device modules 100 along the axis A again by sawing, etching, or laser separation. For example, during the separation, the filling material 122 is only partially removed along the axis A, while the filling material 122 on the sides of the device module 100 is remained.

In the device module and the manufacturing method for the same of the present disclosure, the driver chip, the capacitor, the multiple-phase inductor and other devices are integrated into one chip. The driver chip, the capacitor and the multiple-phase inductor are stacked into a lamination structure of the chip, so that a footprint of the chip is reduced, an integration level of the multiple-phase power supply is improved, and the cost of the chip is reduced.

In addition, the connection relation between the connection points of all parts of the device module is that the connection is achieved by conductive vias which penetrate through material layers. With vertical connection of the conductive vias, the layout and wiring of the multi-phase power supply are optimized. The problem of parasitic capacitance generated between connection points is reduced to a certain extent, and the connection of the multi-phase power supply is simplified.

Moreover, a capacitor layer and the multiple-phase inductor layer are formed into an inductor-capacitor array with an optimized size, by a lamination bonding process, a sintering process and an encapsulation process. Then, the inductor-capacitor array is cut and divided into a plurality of device modules as needed. The process is simple, effectively reducing the manufacturing cost.

Embodiments of the present disclosure have been described above. However, these examples are for illustrative purposes only and are not intended to limit the scope according to the present disclosure. The scope according to the present disclosure is defined by the appended claims and their equivalents. Various substitutions and modifications may be made by those skilled in the art without departing from the scope according to the present disclosure, and such substitutions and modifications are intended to fall within the scope according to the present disclosure.

What is claimed is:

1. A device module comprising:

a first conductive layer, a second conductive layer, and a first functional layer and a second functional layer between the first conductive layer and the second conductive layer, wherein the first functional layer comprises: an upper electrode plate below the first conductive layer; a lower electrode plate above the second functional layer; and a capacitor dielectric layer between the upper electrode plate and the lower electrode plate, wherein the first electrode plate of each of a plurality of capacitors is formed in the upper electrode plate, the second electrode plate of each of the plurality of capacitors is formed in the lower electrode plate, and each of a plurality of via electrodes penetrates through the upper electrode plate, the capacitor dielectric layer, and the lower electrode plate;

a plurality of inductors are formed in the second functional layer, each of which is arranged along a thickness direction of the second functional layer so that a first terminal of the inductor is electrically coupled with the first conductive layer through corresponding one of the via electrodes, and a second terminal of the inductor is electrically coupled with the second conductive layer.

2. The device module according to claim 1, further comprising a driver chip above the first conductive layer, wherein the driver chip is electrically coupled to the plurality of capacitors in the first functional layer and the plurality of inductors in the second functional layer through the first conductive layer.

3. The device module according to claim 2, wherein the driver chip comprises a multi-phase switching power supply chip.

4. The device module according to claim 2, further comprising:

a plurality of pins above the first conductive layer, wherein the plurality of pins are respectively disposed at two sides of the driver chip; and an encapsulation layer which covers the driver chip and exposed portions of the first conductive layer.

5. An inductor-capacitor array, comprising:

a first conductive layer, a second conductive layer, and a lamination structure between the first conductive layer and the second conductive layer, the lamination structure comprising an inductor layer and a capacitor layer, wherein the capacitor layer comprises: an upper electrode plate below the first conductive layer; a lower electrode plate above the inductor layer; and a capacitor dielectric layer between the upper electrode plate and the lower electrode plate, wherein the first electrode plate of each of a plurality of capacitors is formed in the upper electrode plate, the second electrode plate of each of the plurality of capacitors is formed in the lower electrode plate, and each of a plurality of via electrodes penetrates through the upper electrode plate, the capacitor dielectric layer, and the lower electrode plate;

a plurality of inductors are formed in the inductor layer, each of which is arranged along a thickness direction of the inductor layer so that a first terminal of the inductor is electrically coupled with the first conductive layer through corresponding one of the via electrodes, and a second terminal of the inductor is electrically coupled with the second conductive layer.

6. The inductor-capacitor array according to claim 5, wherein the inductor layer comprises:

a core; and a plurality of coils in the core, each of which is formed by winding around an axis along a thickness direction of the core, and both ends of which are led out from opposite end surfaces of the core in the thickness direction.

7. The inductor-capacitor array according to claim 6, wherein the core is formed by sealing the plurality of coils with a sealing material by a resin molding method or an integral die-casting method.

8. The inductor-capacitor array according to claim 5, further comprising a plurality of first scribe lanes extending in a first direction and a plurality of second scribe lanes extending in a second direction, the first and second scribe lanes crossing each other to divide the lamination structure into a plurality of sub-regions, each sub-region comprising a plurality of inductor-capacitor cells.

9. The inductor-capacitor array according to claim 8, further comprising a plurality of driver chips respectively in the plurality of sub-regions, in each sub-region, the plurality of inductor-capacitor cells being electrically coupled to corresponding one of the plurality of driver chips through the first conductive layer.

10. The inductor-capacitor array according to claim 9, further comprising at least one pin on the first scribe lane or the second scribe lane, wherein the at least one pin is configured to be electrically coupled to the first conductive layer.

11. The inductor-capacitor array according to claim 10, wherein at least one pin is shared by adjacent sub-regions.

12. The inductor-capacitor array according to claim 11, wherein the inductor-capacitor array is divided into a plurality of device modules along the first scribe lane and the second scribe lane between the adjacent sub-regions.

13. A manufacturing method for the device module according to claim 1, comprising:

forming a lamination structure comprising an inductor layer and a capacitor layer which are laminated;

forming a first conductive layer on a first surface of the lamination structure;

forming a second conductive layer on a second surface of the lamination structure opposite to the first surface; and dividing the lamination structure into a plurality of sub-regions through a first scribe lane and a second scribe lane, wherein each sub-region comprises a plurality of inductor-capacitor cells, wherein adjacent sub-regions are separated into a plurality of device modules, the step of forming the lamination structure comprises:

providing a capacitor dielectric layer, wherein the capacitor dielectric layer comprises a third surface and a fourth surface which are opposite to each other;

forming a plurality of through holes on the capacitor dielectric layer;

forming an upper electrode plate and a lower electrode plate on the third surface and the fourth surface of the capacitor dielectric layer respectively, wherein the plurality of through holes penetrate through the upper electrode plate, the capacitor dielectric layer and the lower electrode plate;

providing an inductor layer, and attaching the inductor layer to the lower electrode plate, wherein a plurality of inductors are formed in the inductor layer, each of which is arranged along a thickness direction of the inductor layer; and fabricating a conductive material over the upper electrode plate, the conductive material filling the plurality of through holes to form a plurality of via electrodes for electrical connection between the first conductive layer and first terminals of the plurality of inductors.

14. The manufacturing method according to claim 13, after forming the second conductive layer on the second surface of the lamination structure opposite to the first surface, further comprising:

arranging a plurality of driver chips above the first conductive layer, the plurality of driver chips being respectively in the plurality of sub-regions, and in each sub-region, a plurality of inductor-capacitor cells are electrically coupled with corresponding one of the plurality of driver chips through the first conductive layer.

15. The manufacturing method according to claim 14, after arranging the plurality of driver chips over the first conductive layer, further comprising:

arranging at least one pin on a first scribe lane or a second scribe lane, wherein the at least one pin is electrically coupled with the first conductive layer, and adjacent sub-regions share the at least one pin; and forming an encapsulation layer which covers the driver chips and exposed portions of the first conductive layer.

* * * * *